United States Patent
Millner et al.

(10) Patent No.: US 7,353,771 B2
(45) Date of Patent: Apr. 8, 2008

(54) METHOD AND APPARATUS OF PROVIDING POWER TO IGNITE AND SUSTAIN A PLASMA IN A REACTIVE GAS GENERATOR

(75) Inventors: Alan Millner, Lexington, MA (US); Thomas Alexander, Andover, MA (US); Ilya Bystryak, Salem, MA (US); Ken Tran, North Chelmsford, MA (US); Madhuwanti Joshi, Burlington, MA (US)

(73) Assignee: MKS Instruments, Inc., Wilmington, MA (US)

( * ) Notice: Subject to any disclaimer, the term of this patent is extended or adjusted under 35 U.S.C. 154(b) by 0 days.

(21) Appl. No.: 11/268,692

(22) Filed: Nov. 7, 2005

(65) Prior Publication Data

US 2007/0103092 A1    May 10, 2007

(51) Int. Cl.
*C23C 16/00* (2006.01)
(52) U.S. Cl. ............ 118/723 R; 118/715; 118/156
(58) Field of Classification Search ............ 315/111.21–111.71, 326, 349, 354, 355, 315/356; 118/723 R, 715, 156; 427/457
See application file for complete search history.

(56) References Cited

U.S. PATENT DOCUMENTS

| | | | |
|---|---|---|---|
| 4,600,563 A | 7/1986 | Diederich | 422/186.29 |
| 4,859,399 A | 8/1989 | Bussard | 376/133 |
| 5,303,139 A | 4/1994 | Mark | 363/63 |
| 5,394,061 A | 2/1995 | Fujii | 315/111.21 |
| 5,414,238 A | 5/1995 | Steigerwald et al. | 219/121.54 |
| 5,474,648 A | 12/1995 | Patrick et al. | 156/627.1 |
| 5,556,549 A | 9/1996 | Patrick et al. | 216/61 |
| 5,621,331 A | 4/1997 | Smith et al. | 324/645 |
| 5,654,679 A | 8/1997 | Mavretic et al. | 333/17.3 |
| 5,712,592 A | 1/1998 | Stimson et al. | 330/124 R |
| 5,747,935 A | 5/1998 | Porter et al. | 315/111.51 |

(Continued)

FOREIGN PATENT DOCUMENTS

DE    196 50 110 A 1    6/1998

OTHER PUBLICATIONS

Abrie, Pieter L.D., "Design of RF and Microwave Amplifiers and Oscillators," Chapter 4, "Narrowband Impedance-Matching with LC Networks," pp. 125-149, Artech House, Inc., 2000.

(Continued)

*Primary Examiner*—Douglas W. Owens
*Assistant Examiner*—Dieu Hien T Duong
(74) *Attorney, Agent, or Firm*—Proskauer Rose LLP

(57) ABSTRACT

According to a first aspect, a power supply and a method of providing power for igniting a plasma in a reactive gas generator is provided that includes (i) coupling a series resonant circuit that comprises a resonant inductor and a resonant capacitor between a switching power source and a transformer, the transformer having a transformer primary and a plasma secondary; (ii) providing a substantially resonant AC voltage from the resonant capacitor across the transformer primary, thereby inducing a substantially resonant current within the transformer primary to generate the plasma secondary; and (iii) upon generation of the plasma secondary, the resonant inductor limiting current flowing to the switching power supply. According to another aspect, bipolar high voltage ignition electrodes can be used in conjunction with inductive energy coupling to aid in plasma ignition.

22 Claims, 7 Drawing Sheets

U.S. PATENT DOCUMENTS

| | | | | |
|---|---|---|---|---|
| 5,865,937 | A * | 2/1999 | Shan et al. | 156/345.44 |
| 6,150,628 | A | 11/2000 | Smith et al. | 219/121.54 |
| 6,178,102 | B1 | 1/2001 | Stanley | 363/44 |
| 6,225,592 | B1 | 5/2001 | Doughty | 219/121.43 |
| 6,388,226 | B1 | 5/2002 | Smith et al. | 219/121.57 |
| 6,432,260 | B1 * | 8/2002 | Mahoney et al. | 156/345.35 |
| 6,486,431 | B1 | 11/2002 | Smith et al. | 219/121.57 |
| 6,552,296 | B2 | 4/2003 | Smith et al. | 219/121.43 |
| 6,559,408 | B2 | 5/2003 | Smith et al. | 219/121.57 |
| 6,664,497 | B2 | 12/2003 | Smith et al. | 219/121.57 |
| 6,781,317 | B1 | 8/2004 | Goodman | 315/111.21 |
| 6,815,633 | B1 | 11/2004 | Chen et al. | 219/121.54 |
| 6,887,339 | B1 | 5/2005 | Goodman et al. | 156/345.25 |
| 6,924,455 | B1 | 8/2005 | Chen et al. | 219/121.41 |
| 2004/0079287 | A1 | 4/2004 | Smith et al. | 118/715 |
| 2005/0015965 | A1 | 1/2005 | Maier et al. | 29/564 |
| 2005/0041446 | A1 | 2/2005 | Harnett et al. | 363/95 |
| 2005/0057165 | A1 | 3/2005 | Goodman | 315/111.51 |
| 2005/0093459 | A1 | 5/2005 | Kishinevsky | 315/111.21 |
| 2005/0103439 | A1 | 5/2005 | Goodman | 156/345.28 |
| 2005/0219875 | A1 | 10/2005 | Millner et al. | 363/56.01 |
| 2006/0017388 | A1 * | 1/2006 | Stevenson | 315/111.51 |

OTHER PUBLICATIONS

Foutz, Jerrold, "Switching-Mode Power Supply Design," www.smpstech.com, (3 pages).

Heckman, Randy et al., "The Evolution of RF Power Delivery in Plasma Processing," Advanced Energy Industries, Inc., 1998, (8 pages).

Kassakian, John G. et al., "Principles of Power Electronics," Addison-Wesley Publishing Co., Copyright 1991, Chapter 1, (pp. 1-8).

Lenk, John D., "Simplified Design of Switching Power Supplies," Butterworth-Heinemann, Chapter 1, "Switching Power-Supply Basics," Section 1.1, "Basic Switching-Regulator Functions," (p. 1).

Pressman, Abraham I., "Switching Power Supply Design," McGraw-Hill, Inc., Preface, p. xvii.

Advanced Energy, "Introducing Power Supplies and Plasma Systems," (pp. 1-8).

Advanced Energy, "Proven Power for High-Frequency, High-Power, Continuous-Use RF Sputtering Applications," "RFG and RFXII 13.56 MHZ 1250 W Power Supplies," Catalog, 1996, (4 pages).

"The Advanced Energy PE 2500 W, 100 kHz Generator with Load Matching," User Manual, Advanced Energy Industries, Inc., 1989.

"The World's Leading Authority on RF Power," RF Power Products, Inc., Catalog.

Advanced Energy, Product Information, Copyright 2000.

RF Power Products, Inc., Product Information, date unknown.

Cao, S.H., "Design Orientated Model and Application of Electronic Ballasts for Two Toroidal Ferrite Coupled Electrodeless Lamps," *IEEE*, pp. 1764-1769 (2005).

Miyazaki, Hideki, "High-Frequency Class-D Converter Driving with Feedback Capacitors for Electrodeless Fluorescent Lamps," *IEEE*, pp. 1033-1038 (2000).

Annex to Form PCT/ISA/206, Communication Relating to the Results of the Partial International Search, date of mailing Feb. 22, 2007.

International Search Report for International Application No. PCT/US2006/043046, Date of Mailing Aug. 9, 2007, including Written Opinion of the International Searching Authority 23 pages total).

* cited by examiner

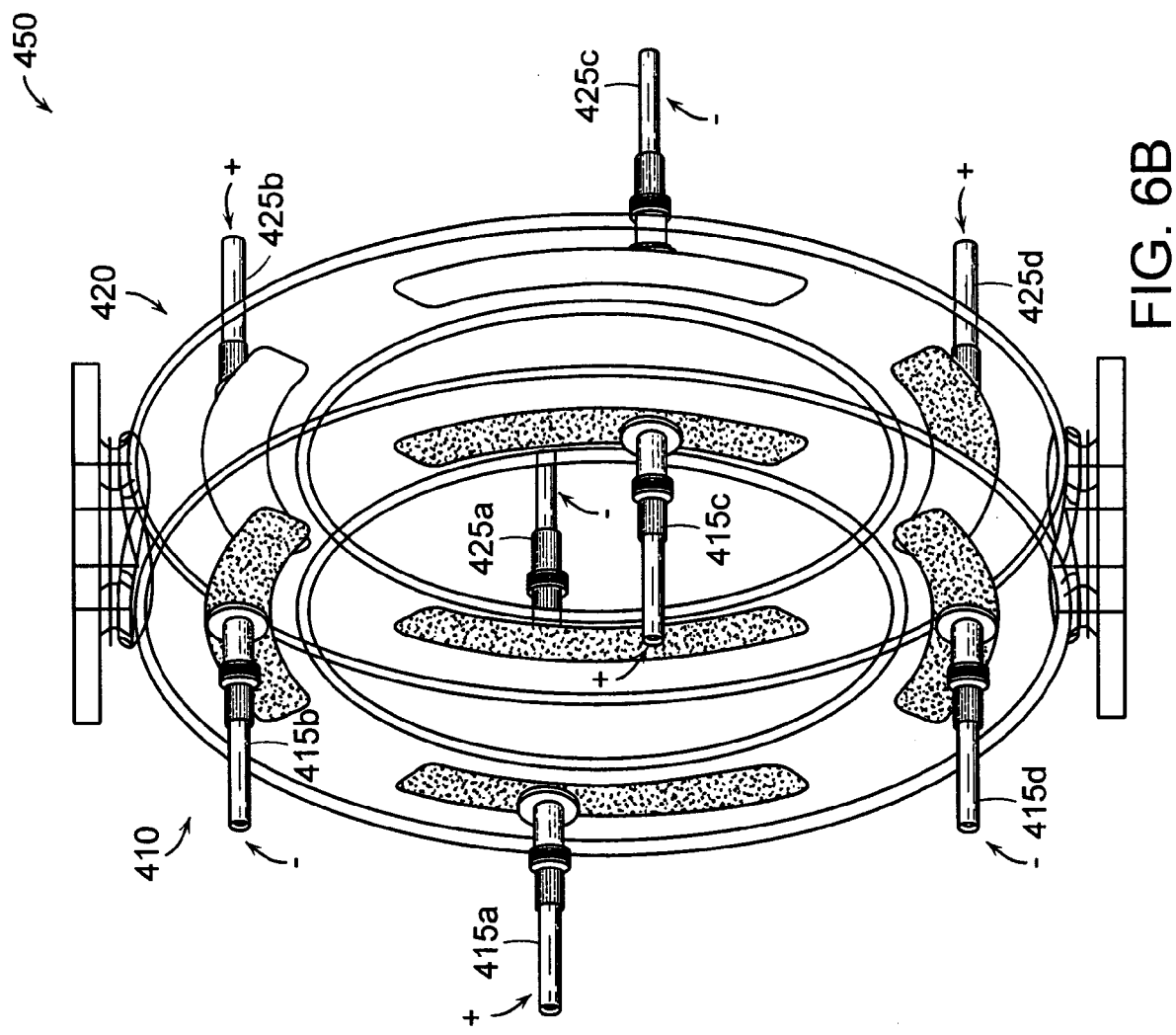
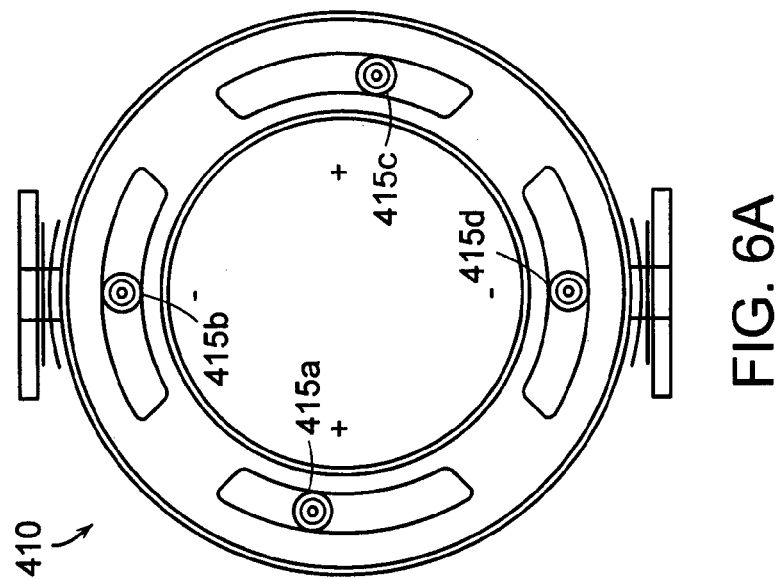
FIG. 6B
FIG. 6A

METHOD AND APPARATUS OF PROVIDING POWER TO IGNITE AND SUSTAIN A PLASMA IN A REACTIVE GAS GENERATOR

FIELD OF THE INVENTION

The invention relates generally to the field of generating reactive gas containing ions, free radicals, atoms and molecules and to apparatus for and methods of providing power for igniting a plasma in a reactive gas generator.

BACKGROUND OF THE INVENTION

Plasma discharges can be used to excite gases to produce reactive gas containing ions, free radicals, atoms and molecules. Reactive gases are used for numerous industrial and scientific applications including processing solid materials such as semiconductor wafers, powders, and other gases.

One example of a reactive gas is atomic fluorine, which can be used to clean chemical vapor deposition (CVD) chambers for deposition of thin films onto substrate surfaces. CVD chambers need to be routinely cleaned to remove the deposits that build up on the surfaces of chamber parts other than the substrate surfaces. Wet cleaning of a chamber is labor intensive and hazardous to workers, while cleaning the chamber with atomic fluorine generated by a plasma source allows the deposits to be removed without opening the chamber to atmosphere, improving tool productivity and working conditions. Typical source gases for atomic fluorine include perfluorocompounds (PFCs) such as $NF_3$, $CF_4$, $CHF_3$, $C_2F_6$, and $C_4F_8$.

Another example of a reactive gas is atomic oxygen, which can be used for photoresist removal in microelectronics fabrication. After pattern generation, photoresist is removed by exposing the wafer surface to atomic oxygen generated by a plasma source. Atomic oxygen reacts rapidly and selectively with photoresist, allowing the process to be conducted in a vacuum and at relatively low temperature.

SUMMARY OF THE INVENTION

Plasma can be generated through inductive coupling of energy from a power supply into a gas that is capable of being transformed into a plasma. Known techniques for providing power to ignite and sustain a plasma include circuitry to prevent damage to power supply semiconductor devices upon plasma ignition. However, such techniques are generally costly and are not reliable.

The invention features methods and power supplies that provide power to ignite and sustain a plasma in a reactive gas generator. Advantages of particular embodiments include prevention of damage to power supply semiconductor devices at reduced cost and increased reliability and performance.

According to a first aspect of the invention, a power supply and a method of providing power for igniting a plasma in a reactive gas generator is provided that includes (i) coupling a series resonant circuit that comprises a resonant inductor and a resonant capacitor between a switching power source and a transformer having a transformer primary and a plasma secondary; (ii) providing a substantially resonant AC voltage from the resonant capacitor across the transformer primary, thereby inducing a substantially resonant current within the transformer primary to generate the plasma secondary; and (iii) upon generation of the plasma secondary, the resonant inductor limiting current flowing to the switching power supply.

Particular embodiments can further include providing a first AC voltage from the switching power source across the series resonant circuit, the first AC voltage having a frequency at a substantially resonant frequency of the series resonant circuit; in response to the first AC voltage, providing the substantially resonant AC voltage from the resonant capacitor across the transformer primary, thereby inducing the substantially resonant current within the transformer primary to generate the plasma secondary; and modulating the frequency of the first AC voltage from the switching power source to a frequency greater than the substantially resonant frequency of the series resonant circuit to further limit the current flowing to the switching power supply subsequent to generation of the plasma secondary.

Particular embodiments can include providing the series resonant circuit with one or more resonant inductors in series with the resonant capacitor, the resonant capacitor coupled in parallel to the transformer primary; and limiting the current flowing to the switching power supply through the one or more inductors upon generation of the plasma secondary. In such embodiments, the method can include providing a first AC voltage from the switching power source across the series resonant circuit, the first AC voltage having a frequency at a substantially resonant frequency of the series resonant circuit; in response to the first AC voltage, providing the substantially resonant AC voltage from the resonant capacitor across the transformer primary, thereby inducing the substantially resonant current within the transformer primary to generate the plasma secondary; and modulating the frequency of the first AC voltage from the switching power source to a frequency greater than the substantially resonant frequency of the series resonant circuit to further limit the current flowing through the one or more inductors to the switching power supply subsequent to generation of the plasma secondary.

Particular embodiments can also include providing the series resonant circuit further including a second capacitor being coupled in series between the one or more resonant inductors and the resonant capacitor or between the resonant capacitor and the transformer, the second capacitor being a DC blocking capacitor or a second resonant capacitor.

Particular embodiments can further include the steps of providing a plasma chamber for containing the plasma secondary; coupling flux from the transformer primary to the plasma secondary through a magnetic core surrounding a portion of the plasma chamber and the transformer primary; and flowing an inlet gas through the plasma secondary to convert the inlet gas into a reactive gas.

According to a second aspect of the invention, a power supply and a method of providing power for igniting a plasma in a reactive gas generator are provided that include (i) providing a transformer having a transformer primary, the transformer primary having a center tap or a substantially center tap; (ii) grounding the center tap of the transformer primary to provide a first lead and a second lead of the transformer primary; (iii) coupling the first lead to a first ignition electrode positioned at a first location about a plasma body and coupling the second lead to a second ignition electrode opposing the first ignition electrode at a second location about the plasma body; and (iv) applying a voltage of a first polarity to the first lead and a voltage of a second polarity to the second lead, resulting in electric field flux traversing a cross sectional area between the first and second electrode to generate the plasma body.

Particular embodiments can further include (v) providing a plasma chamber for containing the plasma secondary; (vi) coupling the first lead to the first ignition electrode on an outer surface of the plasma chamber and coupling the second lead to the second ignition electrode on the outer surface of the plasma chamber opposing the first ignition electrode; and (vii) applying the voltage of the first polarity to the first lead and the voltage of the second polarity to the second lead, resulting in electric field flux traversing a cross sectional area of the plasma chamber between the first and second electrode to generate the plasma body.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 6A and 6B are a schematic diagrams illustrating a particular arrangement of ignition electrodes about a plasma chamber.

DETAILED DESCRIPTION

The invention features methods and power supplies that provide power to ignite and sustain a plasma in a reactive gas generator. Advantages of particular embodiments include prevention of damage to power supply semiconductor devices at reduced cost and increased reliability and performance.

Figure 1:
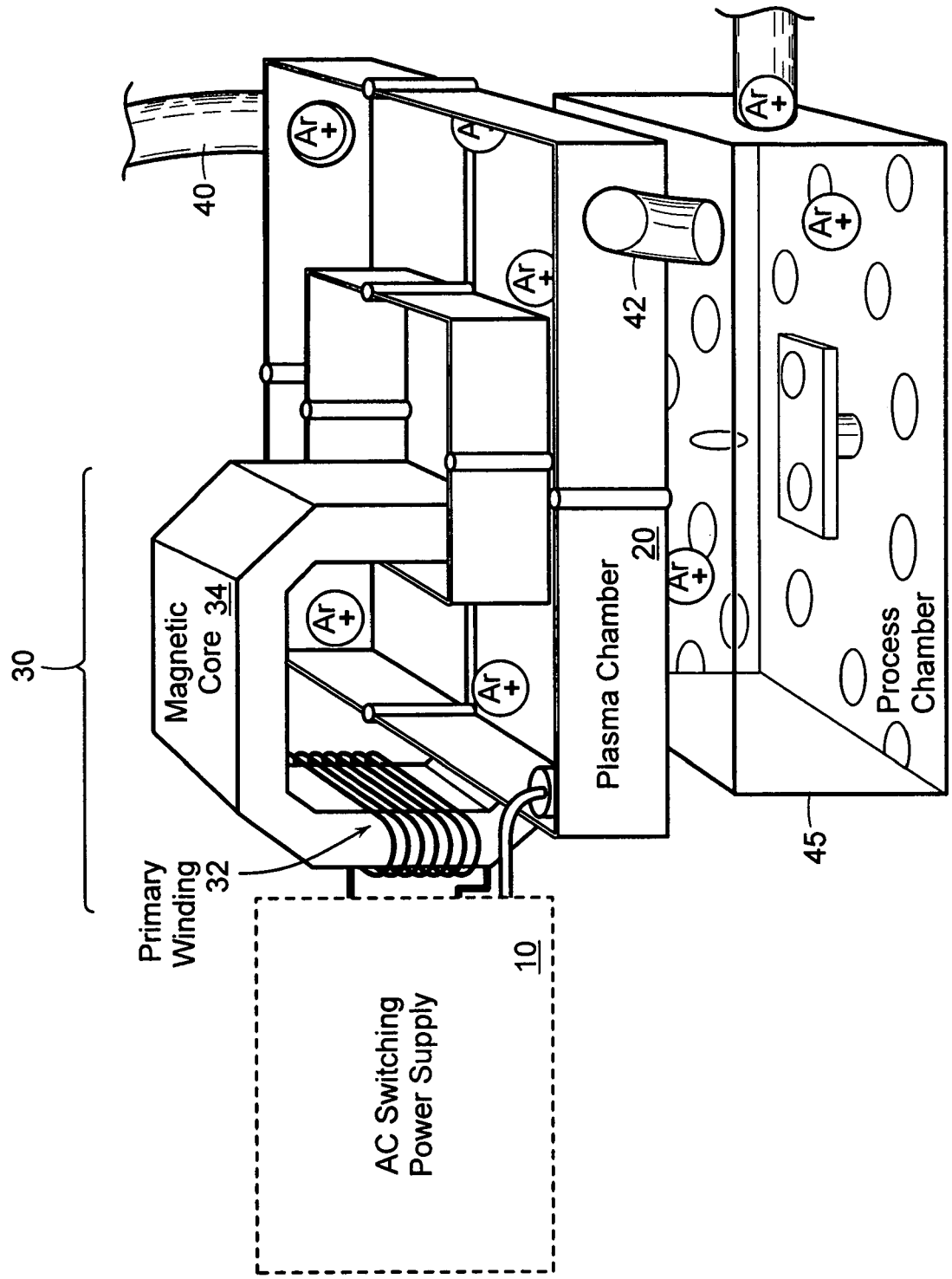
FIG. 1 is a diagram illustrating a reactive gas generator to which embodiments of the invention may be applied.

FIG. 1 is a diagram illustrating a reactive gas generator to which embodiments of the invention may be applied. As illustrated, the reactive gas generator 1 includes a power supply 10 and a plasma chamber 20. The plasma chamber 20 includes an inlet 40 for receiving a gas (e.g., Argon) for transformation into a plasma (e.g., Ar+). Once generated, the plasma may be used directly, or can be used to excite one or more other source gases into corresponding reactive gases that exit the generator at outlet 42 and into, for example, a process chamber 45.

In order to ignite the plasma, the power supply 10 includes a transformer 30. The transformer primary includes a primary winding 32 wrapped about a portion of a magnetic core 34. Energy from the power supply 10 is inductively coupled via the transformer primary to the gas traveling through the chamber 20 to ignite, or generate, the plasma. The ignited plasma within the plasma chamber 20 serves as the transformer secondary. Specifically, the power supply 10 applies an excitation voltage of high magnitude across the primary winding 32 of the transformer. This high excitation voltage induces high voltage current in the winding 32, thereby generating an alternating magnetic field through the magnetic core 34 across a path of the gas. As a result, current is induced within the gas, causing its ignition into a plasma. Once the plasma is generated, the plasma can be used to excite other source gas, producing the desired reactive gas for specific applications.

Figure 2A:
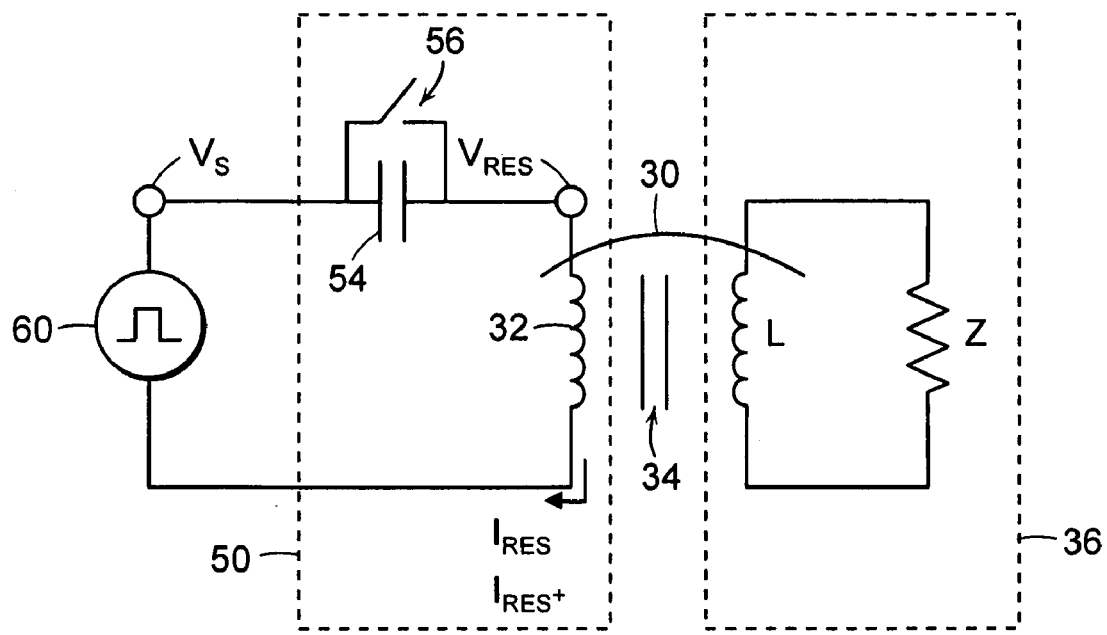
FIGS. 2A and 2B are circuit diagrams illustrating known power supply configurations that provide power to ignite and sustain a plasma.
Figure 2B:
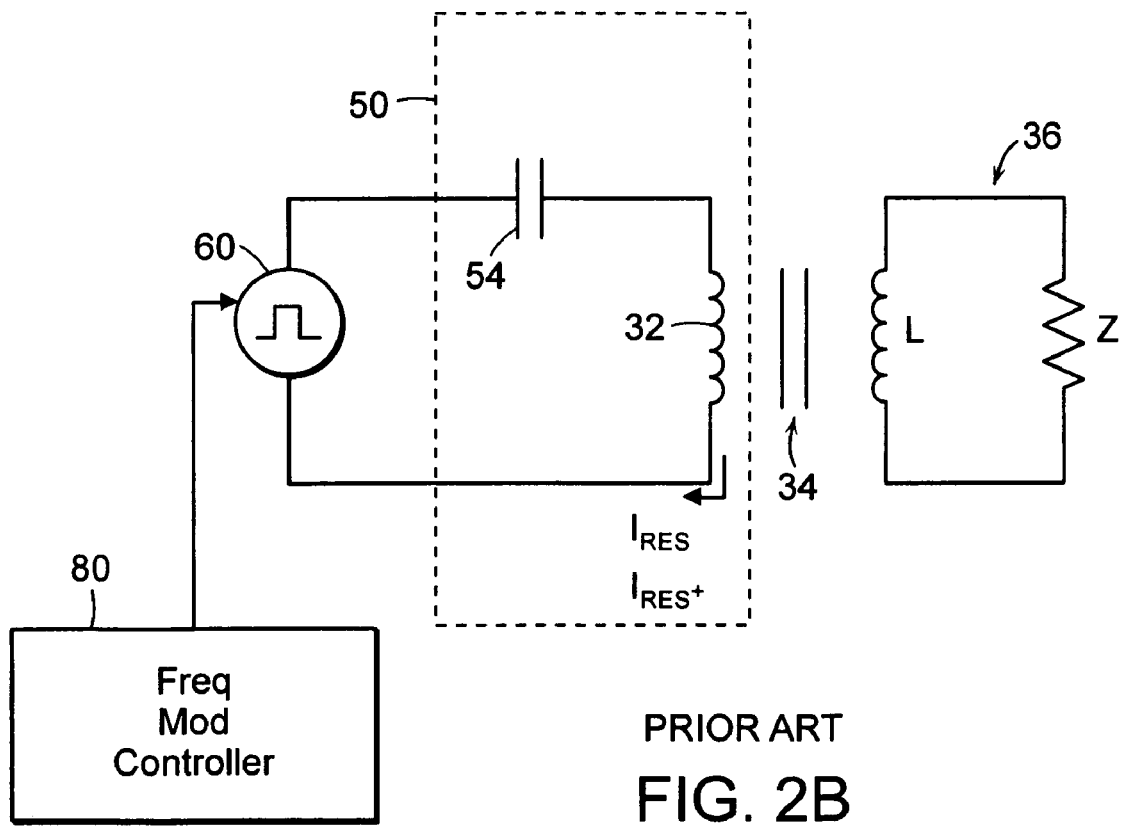

FIGS. 2A and 2B are circuit diagrams representing known power supply configurations that provide power to ignite and sustain a plasma. The plasma secondary 36 of the transformer can be represented as an equivalent circuit having an inductance L and a reactance Z. In both configurations, the power supply includes a series resonant circuit 50 to provide the high excitation voltage to the primary winding 32 of the transformer. Specifically, the series resonant circuit 50 is formed using the primary winding 32 as a resonant inductor and coupling a resonant capacitor 54 in series between a switching power source 60 and the primary winding 32. In response to an excitation voltage Vs from the switching power source 60 having a frequency at or near the resonant frequency of the resonant circuit 50, a resonant voltage or a substantially resonant voltage $V_{RES}$ is applied across the primary winding 32 of the transformer 30 inducing a high voltage, resonant current $I_{RES}$ in the primary winding 32 for triggering ignition of the plasma as previously described.

Prior to plasma ignition, the inductance of primary winding 32 in FIGS. 2A and 2B limits the high voltage, resonant current $I_{RES}$ to a safe operating level for return to the switching power source 60. However, once the plasma ignites, the inductance of the primary winding 32 is reduced (e.g., effectively shorted), enabling additional current to flow to the switching power source 60. Also, due to the reduced inductance, the load at this operating frequency becomes capacitive, which is known by those familiar with this art to cause stressful hard transitions in the AC source. Both the high current and the hard transitions can be a potential hazard causing damage to constituent semiconductor devices of the power source (e.g., FETs, MOSFETs, IGBTs and the like). A short circuit current, as used herein, refers to any increase in current flowing through the primary winding as a result of the reduced inductance of the winding upon ignition of the plasma.

In order to limit the high circuit current after plasma ignition, the circuit of FIG. 2A includes a controllable relay 56 bridged across the resonant capacitor 54. In operation, the relay 56 is open during ignition of the plasma to couple the resonant capacitor 54 to the circuit and closed after plasma ignition to decouple the capacitor 54 from the circuit. By decoupling the capacitor 54 from the circuit, the resonant voltage $V_{RES}$ drops to the source excitation voltage $V_s$ across the primary winding 32 resulting in a reduction in the current induced in the primary winding and the current flowing back to the power source 60. Also, the load is no longer capacitive, since the relay removes the capacitor from the active circuit. Thus, the likelihood of semiconductor damage within with switching power source is reduced.

Disadvantages of this power supply configuration, however, include the high cost associated with the circuit due to the need for the relay 56 and the time delays or potential failures of the relay 56 and plasma ignition detection circuitry (not shown). If detection of plasma ignition fails or is delayed, short circuit current $I_{RES}+$ can return to the power source causing damage. This circuit requires very fast response of the electronics to avoid destructive damage to the power semiconductors providing the excitation voltage.

With respect to FIG. 2B, the high circuit current $I_{RES}+$ is limited using frequency modulation of the source excitation voltage. Specifically, the switching power source 60 utilizes frequency modulation to provide excitation voltages $V_s$ of varying frequency in order to control the current returning to the switching power source. Prior to plasma ignition, the switching power source 60 provides a source excitation voltage $V_s$ having a frequency at or near the resonant frequency of the series resonant circuit 50. Once plasma ignition is detected, a frequency modulation controller 80 adjusts the frequency of the excitation voltage $V_s$ away from the resonant frequency, causing a reduction in the magnitude of the voltage $V_{RES}$ applied to the primary winding 32 and thus a decrease in the current returning to the switching power source 60.

By controlling the frequency of the source excitation voltage, this circuit can control the current through the primary winding 32 without the need for a relay. However, like the circuit of FIG. 2A, semiconductor damage can still occur if detection of plasma ignition fails or is delayed causing a high circuit current $I_{RES}+$ to return to the power source. The frequency range required for safe operation may exceed the capabilities of the circuit elements. This circuit also requires very fast response of the electronics to avoid destructive damage to the power semiconductors providing the excitation voltage.

The present invention features methods and power supplies that provide power to ignite and sustain a plasma in a reactive gas generator. Advantages of particular embodiments include prevention of damage to power supply semiconductor devices at reduced cost and increased reliability and performance.

Figure 3A:
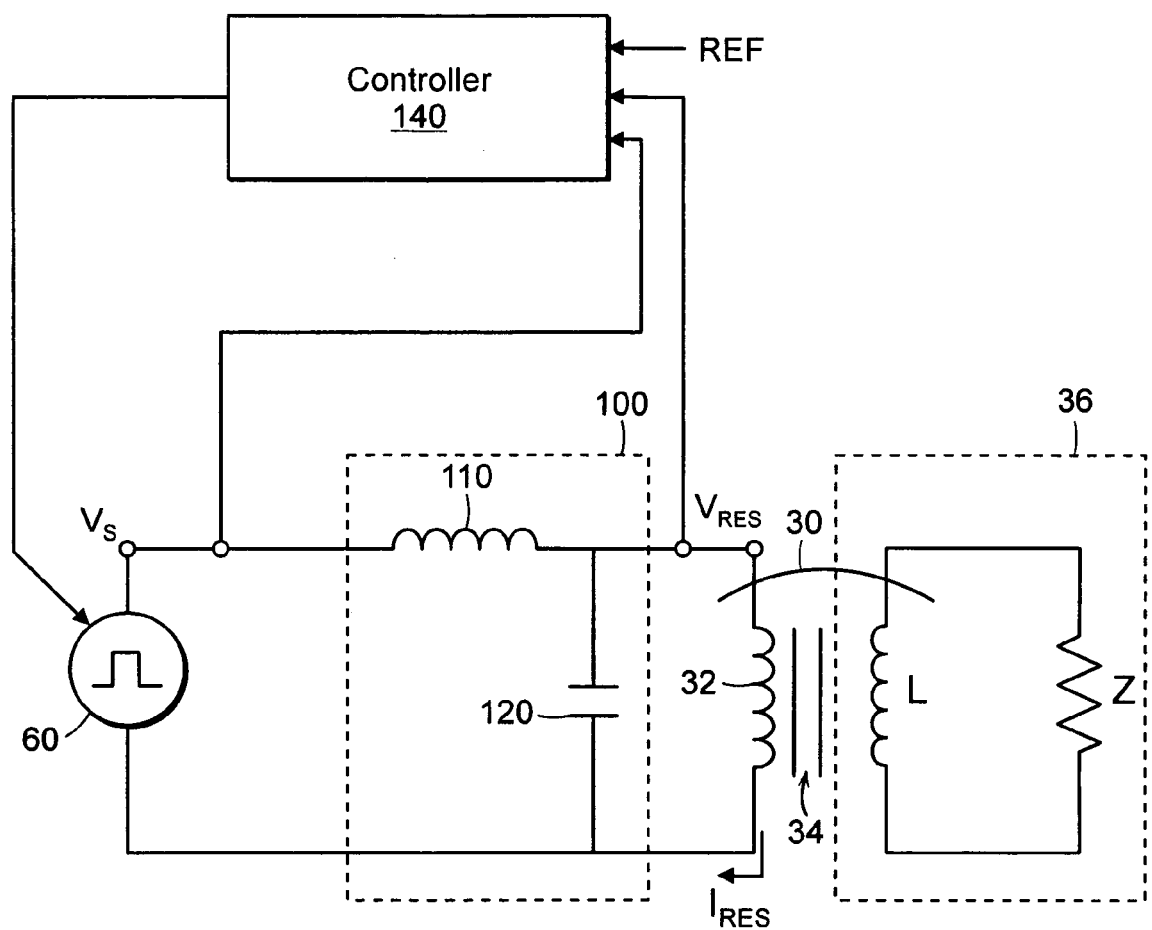
FIG. 3A is a circuit diagram illustrating a power supply that provides power to ignite and sustain a plasma in a reactive gas generator according to one embodiment.

FIG. 3A is a circuit diagram illustrating a power supply that provides power to ignite and sustain a plasma in a reactive gas generator. In this embodiment, the power supply includes a switching power source 60, a transformer 30 comprising a primary winding 32, magnetic core 34, and a plasma secondary 36. A series resonant circuit 100 is driven by the switching power source 60 and is coupled with its capacitor in parallel with the switching power source 60 and the transformer 30. The series resonant circuit includes an LC circuit having a resonant inductor 110 in series with a resonant capacitor 120. The resonant capacitor 120 in turn is coupled in parallel to the primary winding 32. The resonant inductor 110 and resonant capacitor 120 form a low pass filter network.

In operation, the switching power source 60 can be a half bridge or full bridge power converter as known in the art or as described in U.S. patent application Ser. No. 11/077,555, entitled "Control Circuit for Switching Power Supply," the entire contents of which are incorporated herein by reference. The power source 60 provides an AC excitation voltage $V_s$ having a frequency at or substantially at the resonant frequency of the series resonant circuit. In one embodiment, the frequency of the excitation voltage is above the resonant frequency of the resonating inductance and capacitance. For higher current and power, the frequency is closer to the resonance. For lower current and power, the frequency is farther from it. Typically, the frequency shifts by less than 50% of the resonant frequency over the required range. For a Q factor of 10 for the circuit with no ignition, the current shifts a small fraction (much less than 10%) of the maximum value. In practice, the commanded value of resonant current during ignition is preferably 1.5 to 3 times the value needed for steady state plasma operation.

The excitation voltage $V_s$ is applied across the series resonant circuit 100, causing the resonant circuit to provide a substantially resonant AC voltage $V_{RES}$ across the transformer primary, inducing a substantially resonant current $I_{RES}$ within the transformer primary to ignite the plasma.

The generated plasma 36 serves as the secondary of transformer 30. The plasma secondary can be represented with an equivalent circuit having an inductance L and a reactance Z. However, it should be understood that the plasma secondary 36 is actually a body of plasma traversing a volume within a plasma chamber. The plasma chamber 20 can be manufactured in the shape of a toroid or other shapes that provide a toroidal flow of the gas.

Once the plasma ignites, a short circuit current does not flow to the switching power source 60. Rather, although the inductance of the primary winding 32 of the transformer 30 is reduced after plasma ignition, the resonant inductor 110 of the series resonant circuit 100 continues to serve as a low pass filter limiting current through the primary winding 32 to a safe operating level for return to the switching power supply 60. Also, the effect of the reduced plasma impedance reflected through the transformer across the capacitor 120 results in an inductive load, avoiding the stressful hard transitions. Thus, damage to the constituent semiconductor devices in the power source 60 due to high current is substantially prevented. Advantages of this embodiment include reduced cost due to the lack of a relay component and increased reliability due to the circuit's ability to limit current regardless of whether plasma ignition is detected.

Figure 3B:
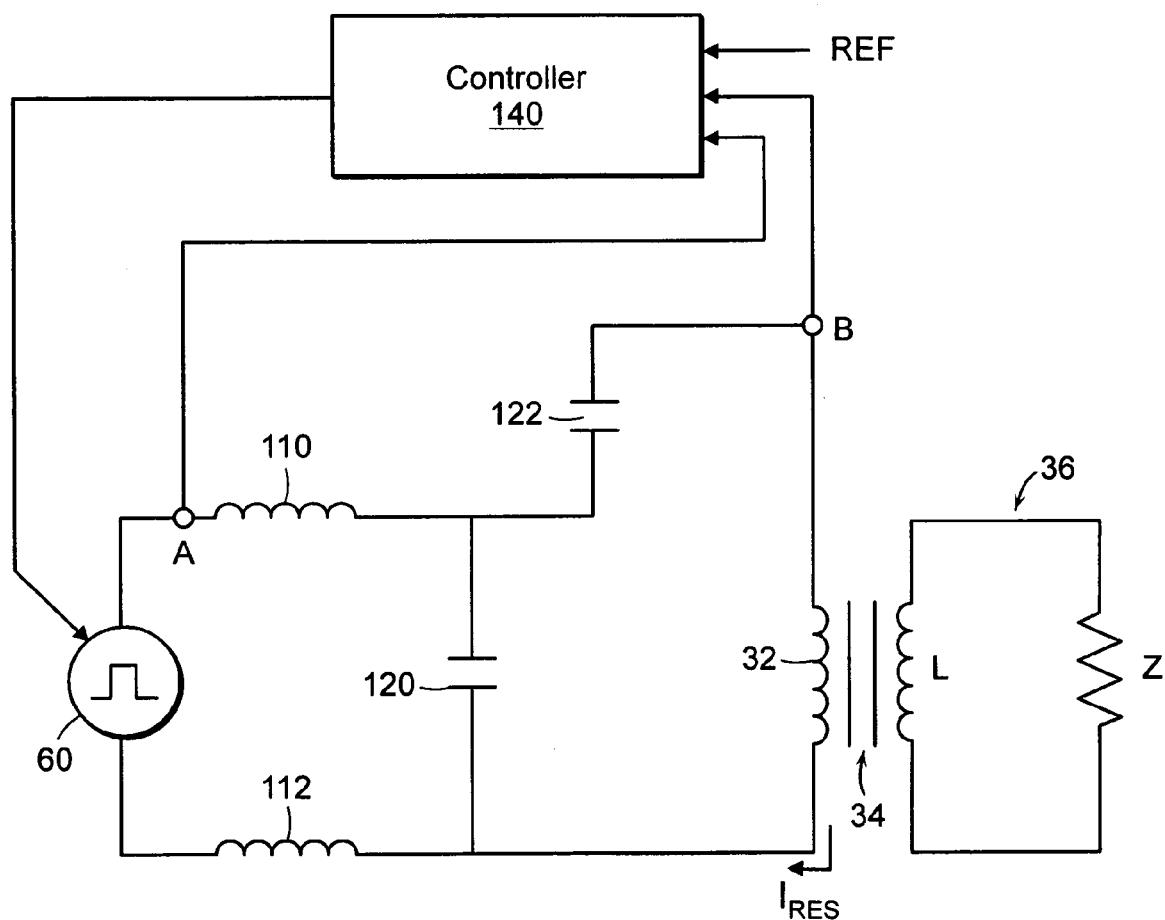
FIG. 3B is a circuit diagram illustrating a power supply that provides power to ignite and sustain a plasma in a reactive gas generator according to another embodiment.

FIG. 3B is a circuit diagram illustrating a power supply that provides power to ignite and sustain a plasma in a reactive gas generator according to another embodiment. In this illustrated diagram, the power supply is similar to that of FIG. 3A except that the circuit includes one or more additional capacitors 122 in series with the resonant capacitor 120. These additional capacitors, which may be placed either between the inductor and the original resonant capacitor or between the original resonant capacitor and the transformer, may serve as DC blocking capacitors or additional resonant capacitors. The circuit also includes an additional resonant inductor 112 coupled in series with the resonant capacitor 120 to assist during plasma ignition and to limit current flowing back to the power source after plasma ignition.

According to another embodiment, the power supplies of FIGS. 3A and 3B can include a controller 140 that can be used to further control the flow of current and power into the plasma gas in response to detection of plasma ignition. In the illustrated embodiment, the controller 140 provides signals to the switching power source 60 that can cause the power source to modulate the frequency and/or duty cycle (e.g., pulse width modulation or PWM) of the AC excitation voltage $V_s$, resulting in a desired current flowing within the power supply circuit. The desired current can be configured by setting a reference current REF that is input to the controller 140. The controller 140 (i) senses the current at one or more predetermined positions (e.g., positions A, B) in the circuit (ii) compares it with the reference current, and (iii) sends control signals to the switching power source 60 to make adjustments to the operating frequency or duty cycle of the power source using known frequency modulation or pulse width modulation techniques.

For example, once the gas ignites into a plasma, the inductance of the transformer is reduced driving additional current through the primary winding. This condition is detected by a current sensor at points A or B which feeds back to the controller 140 to shift the frequency away from the resonant frequency to a frequency for maintenance of the plasma flow and safe operation of the power supply. The frequency is increased, reducing the amount of current by the action of the resonant inductors. This provides a means of regulating the current or power flow by sensing this parameter anywhere in the circuit and adjusting the frequency to achieve the desired level of excitation of the gas. Alternately or in conjunction with frequency modulation, pulse width modulation (PWM) can be used to adjust the duty cycle of the switching power source to achieve a broader dynamic range of regulation. According to a particular embodiment, low output current can be regulated with pulse width modulation (PWM) while power can be regulated with pulse frequency modulation (PFM), or vice versa. This combined use of PFM and PWM results in a broader dynamic range of regulation for the entire power conversion system. Another advantage of the combined use of PFM and PWM is reduced reverse recovery stress on the body diode of MOSFETs in the switching power source at low current or power, as opposed to regulating with PFM alone in which the modulating frequencies must approach the Megahertz range.

According to another aspect of the invention, bipolar high voltage ignition electrodes can be used in conjunction with inductive energy coupling to aid in plasma ignition. Preferably, the ignition electrodes are arranged in or about the plasma chamber for capacitively coupling energy to the gas flowing within the chamber to ignite and sustain a plasma. The voltages impressed upon the ignition electrodes to ignite and sustain a plasma are typically controlled by a high voltage ignition controller. Once the plasma is generated, the energy coupled through inductance, as previously described in FIGS. 1-3B, is sufficient to maintain the plasma state and the ignition electrodes can be disabled, or otherwise "turned off."

Figure 4A:
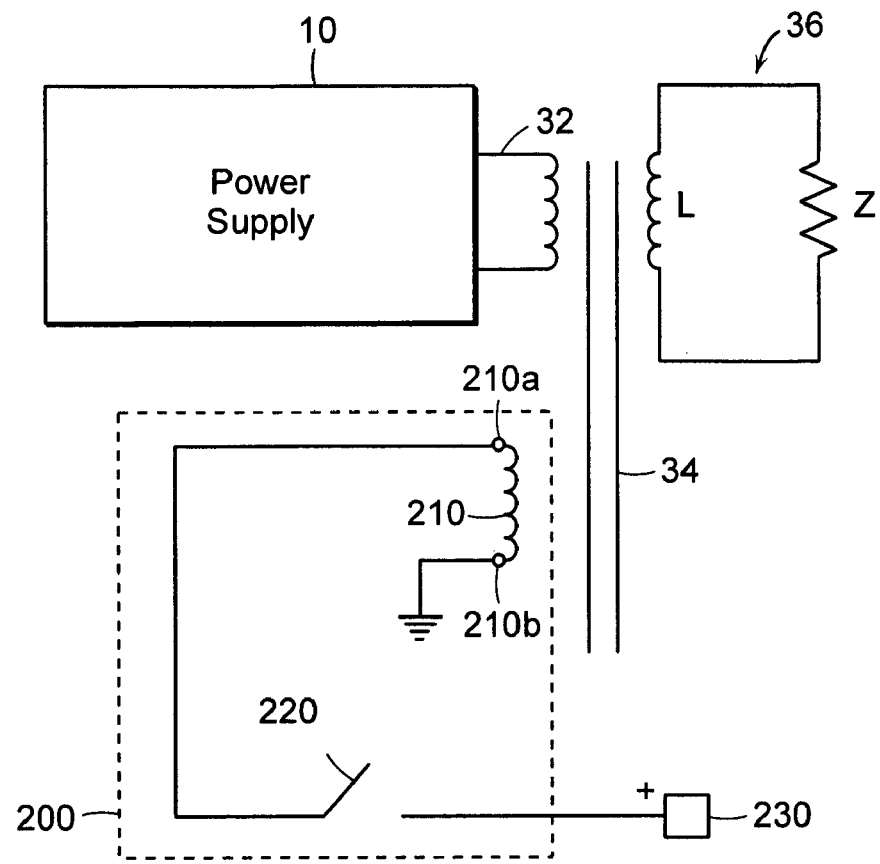
FIGS. 4A and 4B are diagrams that illustrate a high voltage ignition controller and an arrangement of corresponding ignition electrodes according to the prior art.
Figure 4B:
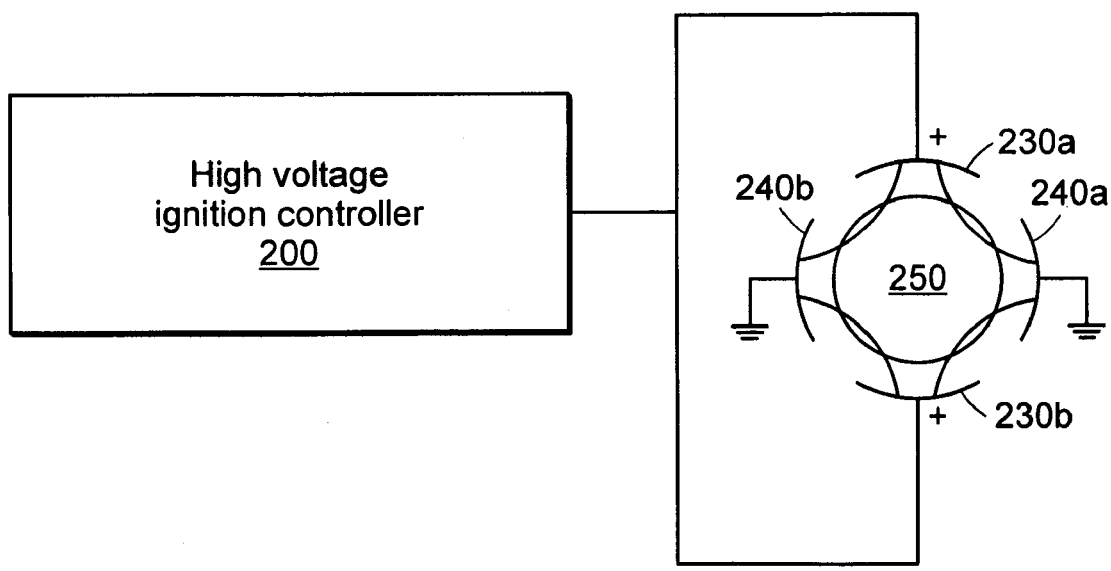

FIGS. 4A and 4B are diagrams that illustrate a high voltage ignition controller and an arrangement of corresponding ignition electrodes according to the prior art. Specifically, the high voltage ignition controller 200 includes a second transformer primary in the form of a winding 210 wrapped about a portion of the magnetic core 34 of the transformer 30. When the power supply 10 provides an excitation voltage across the primary winding 32, a current is induced within the secondary primary winding 210 according to a turns ratio. A first lead 210a of the winding is grounded, while the second lead is switchably connected to one or more electrodes 230 arranged about or within the plasma chamber 30. During plasma ignition, the relay 220 of the controller 200 is closed so that the voltage from the second lead 210b can be applied to the one or more ignition electrodes 230. Once the plasma ignites, the relay 220 is opened, disabling the capacitive discharge.

FIG. 4B illustrates a typical arrangement of ignition electrodes positioned about a cross section of a plasma chamber or channel within the chamber 250. Specifically, ignition electrodes 230a, 230b are positioned on opposing sides of the plasma chamber 250 and are switchably connected to the second lead of the secondary primary winding 210b, resulting in both electrodes having the same polarity. Ground electrodes 240a, 240b are also positioned on opposing sides of the plasma chamber or channel 250 at an offset between the ignition electrodes 230a, 230b.

When the high voltage ignition controller 200 directs the relay 220 to connect the ignition electrodes, the voltage at the second lead 210b is applied to both electrodes 230, generating a spatially limited electric field between ignition electrodes 230 and ground electrodes 240 as shown. This limited electric field, or fringe field, can fail to ignite a plasma under certain gas flow and pressure conditions within the chamber, or can fail to propagate the ignition into the bulk of the plasma. Thus, in those instances, a stronger electric field is required in order to ignite the plasma. Prior art techniques involve higher voltages being applied to the ignition electrodes 230 to generate the requisite electric flux, resulting in increased insulation and its related cost.

A second aspect of the invention addresses this issue through the use of a central ground tap that is connected to the secondary primary winding. The use of a central ground tap results in the leads that extend from the secondary primary winding being bipolar and, thus, enables the generation of positive ignition electrodes and negative ignition electrodes. By placing the positive and negative ignition electrodes such that they oppose one another, an increase in the amount of electric flux that can be realized across the plasma chamber or channel. This results in less voltage to ground being required to generate the requisite amount of electric flux to ignite the plasma gas.

Figure 5A:
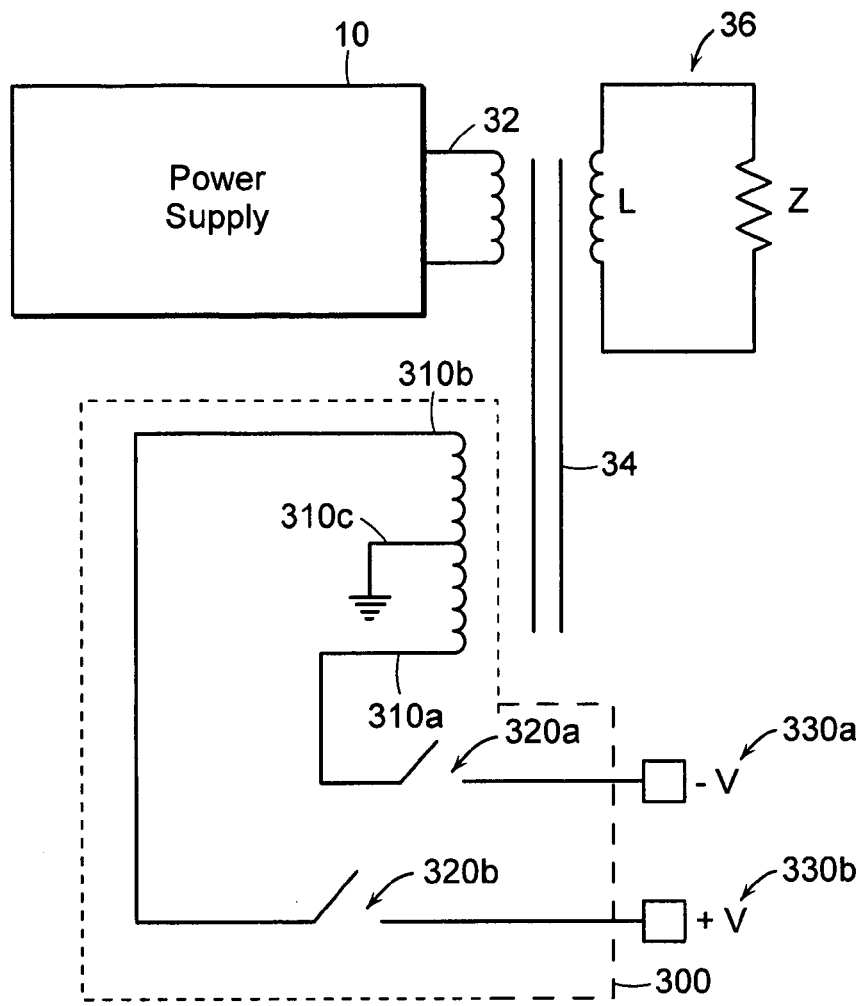
FIGS. 5A and 5B are diagrams that illustrate a high voltage ignition controller and an arrangement of corresponding ignition electrodes according to one embodiment.
Figure 5B:
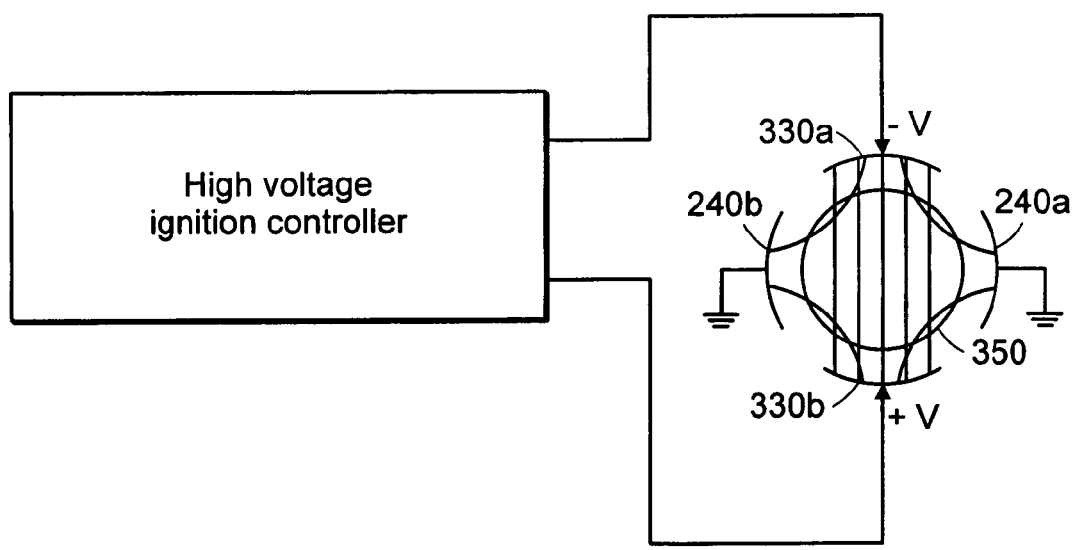

FIGS. 5A and 5B are diagrams that illustrate a high voltage ignition controller and an arrangement of corresponding ignition electrodes according to one embodiment. Specifically, the high voltage ignition controller 300 includes a second transformer primary in the form of a winding 310 wrapped about a portion of the magnetic core 34 of the transformer 30. The second transformer primary 310 includes a center tap or a substantially center tap 310c that is grounded to provide a first lead 310a having a first polarity and a second lead 310b having a second polarity that is different from the first.

For example, when the power supply 10 provides an excitation voltage across the primary winding 32, a current is induced within the secondary primary winding 310, such that a negative polarity voltage −V can be applied to the first lead 310a and a positive polarity voltage +V can be applied to the second lead 310b. Both the first lead 310a and the second lead 310b are switchably connected to a respective ignition electrode 330a, 330b through relays 320a, 320b, if this is desired for example to extend electrode life.

In this illustrated embodiment, the first lead 310a is coupled to the first ignition electrode 330a on an outer surface of the plasma chamber 350 and the second lead 310b is coupled to the second ignition electrode 330b on the outer surface of the plasma chamber 350 opposing the first ignition electrode 330a. Ground electrodes 240a, 240b can also be positioned on opposing sides of the plasma chamber or channel 300 at an offset between the ignition electrodes 330a, 330b.

During plasma ignition, the relays 320a, 320b of the controller 300 are closed so that the positive voltage of the first lead 310a and the negative voltage of the second lead 310b are applied to the respective ignition electrodes 330a, 330b, resulting in a strong electric field flux traversing a cross sectional area of the plasma chamber or channel 350 between the first and second electrodes to generate the plasma secondary. Once the plasma ignites, the relays 320a, 320b can be opened, disabling the capacitive discharge.

FIGS. 6A and 6B are schematic diagrams illustrating a particular arrangement of ignition electrodes about a plasma chamber. FIG. 6A represents a view of an outer surface 410 of a plasma chamber having ignition electrodes 415a, 415b, 415c, and 415d. Each electrode is associated with a positive or negative polarity. Referring to FIG. 6B, a three dimensional view of a plasma chamber is shown with the outer surface 410 of FIG. 6A having an opposing outer surface 420. FIG. 6B illustrates that the opposing surface 420 of the chamber 450 includes ignition electrodes 425a, 425b, 425c and 425d having polarities that directly oppose the electrode polarities of surface. According to such configurations, a strong electric field flux can be generated within the plasma chamber between the bipolar electrodes on the opposing surfaces 410, 420 during plasma ignition. As a result, the requisite amount of electric flux to ignite the plasma gas can be realized without a corresponding increase in applied voltage to the ignition electrodes.

Although embodiments of the invention have been described with respect to exemplary circuit diagrams, the invention is not so limited. Furthermore, other embodiments of the invention may include alternative implementation details, including the use of hybrid circuits, discrete circuits, MOSFETs, IGBTs and others known to those skilled in the art.

While this invention has been particularly shown and described with references to preferred embodiments thereof, it will be understood by those skilled in the art that various changes in form and details may be made therein without departing from the scope of the invention encompassed by the appended claims.

What is claimed:

1. A method of providing power for igniting a plasma in a reactive gas generator, comprising:
   inductively coupling a power supply remote from a plasma chamber containing a gas capable of being transformed into a plasma, the remote power supply comprising a series resonant circuit coupled between a switching power source and a transformer, the series resonant circuit further comprising a resonant inductor in series with a resonant capacitor and the resonant capacitor in parallel with a transformer primary of the transformer;
   providing a substantially resonant AC voltage from the series resonant circuit across the transformer primary to induce a substantially resonant current within the transformer primary which transforms the gas in the plasma chamber into a plasma secondary of the transformer; and
   upon generation of the plasma secondary, the resonant inductor limiting current flowing to the switching power supply.

2. The method of claim 1 further comprising:
   providing a first AC voltage from the switching power source across the series resonant circuit, the first AC voltage having a frequency at a substantially resonant frequency of the series resonant circuit;
   in response to the first AC voltage, providing the substantially resonant AC voltage from the series resonant circuit across the transformer primary to induce the substantially resonant current within the transformer primary which transforms the gas in the plasma chamber into the plasma secondary of the transformer; and
   modulating the frequency of the first AC voltage from the switching power source to a frequency greater than the substantially resonant frequency of the series resonant circuit to further limit the current flowing to the switching power supply subsequent to generation of the plasma secondary.

3. The method of claim 1 further comprising:
   coupling a plurality of resonant inductors in series with the resonant capacitor of the series resonant circuit, such that at least one resonant inductor is coupled in series to each end of the resonant capacitor;
   limiting the current flowing to the switching power supply through the plurality of inductors upon generation of the plasma secondary.

4. The method of claim 3 further comprising:
   providing a first AC voltage from the switching power source across the series resonant circuit, the first AC voltage having a frequency at a substantially resonant frequency of the series resonant circuit;
   in response to the first AC voltage, providing the substantially resonant AC voltage from the series resonant circuit across the transformer primary to induce the substantially resonant current within the transformer primary which transforms the gas in the plasma chamber into the plasma secondary of the transformer; and
   modulating the frequency of the first AC voltage from the switching power source to a frequency greater than the substantially resonant frequency of the series resonant circuit to further limit the current flowing through the plurality of inductors to the switching power supply subsequent to generation of the plasma secondary.

5. The method of claim 1 further comprising:
   coupling a second capacitor in series between the resonant inductor and the resonant capacitor or in series between the resonant capacitor and the transformer, the second capacitor being a DC blocking capacitor or a second resonant capacitor.

6. The method of claim 1 wherein the switching power source is a half bridge inverter.

7. The method of claim 1 wherein the switching power source is a full bridge inverter.

8. The method of claim 1 further comprising:
   coupling flux from the transformer primary to the plasma secondary through a magnetic core surrounding a portion of the plasma chamber and the transformer primary; and
   flowing an inlet gas through the plasma secondary to convert the inlet gas into a reactive gas.

9. A method of providing power for igniting a plasma in a reactive gas generator, comprising:
   coupling a series resonant circuit that comprises a resonant inductor and a resonant capacitor between a switching power source and a transformer, the transformer having a transformer primary and a plasma secondary;
   providing a substantially resonant AC voltage from the series resonant circuit across the transformer primary to induce a substantially resonant current within the transformer primary for generating the plasma secondary;
   upon generation of the plasma secondary, the resonant inductor limiting current flowing to the switching power supply;
   coupling a secondary winding to the transformer, the secondary winding having a center tap or a substantially center tap;
   grounding the center tap of the secondary winding to provide a first lead and a second lead of the secondary winding;
   coupling the first lead to a first ignition electrode positioned at a first location about the plasma secondary and coupling the second lead to a second ignition electrode opposing the first ignition electrode at a second location about the plasma secondary; and
   applying a voltage of a first polarity to the first lead and a voltage of a second polarity to the second lead, resulting in electric field flux traversing a cross sectional area between the first and second electrode to generate the plasma secondary.

10. The method of claim 9 further comprising:
providing a plasma chamber for containing the plasma secondary; and
coupling the first lead to the first ignition electrode on an outer surface of the plasma chamber and coupling the second lead to the second ignition electrode on the outer surface of the plasma chamber opposing the first ignition electrode; and
applying a voltage of a first polarity to the first lead and a voltage of a second polarity to the second lead, resulting in the electric field flux traversing a cross sectional area of the plasma chamber between the first and second electrode to generate the plasma secondary.

11. A power supply for igniting a plasma in reactive gas generator, comprising:
a switching power source;
a transformer comprising a transformer primary; and
a series resonant circuit coupled between the switching power source and the transformer primary, the series resonant circuit further comprising a resonant inductor in series with a resonant capacitor and the resonant capacitor in parallel with the transformer primary;
the switching power source, the series resonant circuit and the transformer primary being inductively coupled to and remote from a plasma chamber containing a gas capable of being transformed into a plasma;
the series resonant circuit providing a substantially resonant AC voltage across the transformer primary to induce a substantially resonant current within the transformer primary which transforms the gas in the plasma chamber into a plasma secondary of the transformer;
upon generation of the plasma secondary, the resonant inductor limiting current flowing to the switching power supply.

12. The power supply of claim 11 further comprising:
a controller;
the switching power source providing a first AC voltage across the series resonant circuit, the first AC voltage having a frequency at a substantially resonant frequency of the series resonant circuit;
in response to the first AC voltage, the series resonant circuit providing the substantially resonant AC voltage from across the transformer primary to induce the substantially resonant current within the transformer primary which transforms the gas in the plasma chamber into the plasma secondary of the transformer;
the controller providing signals to the switching power source to modulate the frequency of the first AC voltage to a frequency greater than the substantially resonant frequency of the series resonant circuit to further limit the current flowing to the switching power supply subsequent to generation of the plasma secondary.

13. The power supply of claim 11 wherein the series resonant circuit comprises:
a plurality of resonant inductors in series with the resonant capacitor, such that at least one resonant inductor is coupled in series to each end of the resonant capacitor;
the plurality of resonant inductors limiting the current flowing to the switching power supply upon generation of the plasma secondary.

14. The power supply of claim 13 further comprising:
a controller;
the switching power source providing a first AC voltage across the series resonant circuit, the first AC voltage having a frequency at a substantially resonant frequency of the series resonant circuit;
in response to the first AC voltage, the series resonant circuit providing the substantially resonant AC voltage across the transformer primary to induce the substantially resonant current within the transformer primary which transforms the gas in the plasma chamber into the plasma secondary of the transformer;
the controller modulating the frequency of the first AC voltage from the switching power source to a frequency greater than the substantially resonant frequency of the series resonant circuit to further limit the current flowing through the plurality of resonant inductors to the switching power supply subsequent to generation of the plasma secondary.

15. The power supply of claim 11 wherein the series resonant circuit further comprises:
a second capacitor being coupled in series between the resonant inductor and the resonant capacitor or in series between the resonant capacitor and the transformer, the second capacitor being a DC blocking capacitor or a second resonant capacitor.

16. The power supply of claim 11 wherein the switching power source comprises a half bridge inverter.

17. The power supply of claim 11 wherein the switching power source comprises a full bridge inverter.

18. The power supply of claim 11 further comprising:
a magnetic core surrounding a portion of the plasma chamber and the transformer primary for coupling flux from the transformer primary to the plasma secondary.

19. A power supply for igniting a plasma in reactive gas generator, comprising:
a switching power source;
a transformer comprising a transformer primary and a plasma secondary; and
a series resonant circuit comprising a resonant inductor and a resonant capacitor coupled between the switching power source and the transformer primary,
the series resonant circuit providing a substantially resonant AC voltage across the transformer primary to induce a substantially resonant current within the transformer primary for generating the plasma secondary;
upon generation of the plasma secondary, the resonant inductor limiting current flowing to the switching power supply;
a secondary winding coupled to the transformer, the secondary winding having a center tap or a substantially center tap being grounded to provide a first lead and a second lead of the secondary winding;
a first ignition electrode positioned at a first location about the plasma secondary, the first ignition electrode being coupled to the first lead; and
a second ignition electrode opposing the first ignition electrode at a second location about the plasma secondary, the second ignition electrode being coupled to the second lead;
the secondary winding applying a voltage of a first polarity to the first lead and a voltage of a second polarity to the second lead, resulting in electric field flux traversing a cross sectional area between the first and second electrode to generate the plasma secondary.

20. The power supply of claim 19 further comprising:
a plasma chamber containing the plasma secondary;
the first lead being coupled to the first ignition electrode on an outer surface of the plasma chamber and the second lead being coupled to the second ignition electrode on the outer surface of the plasma chamber opposing the first ignition electrode;

the secondary winding applying the voltage of a first polarity to the first lead and the voltage of the second polarity to the second lead, resulting in the electric field flux traversing a cross sectional area of the plasma chamber between the first and second electrode to generate the plasma secondary.

21. A power supply for igniting a plasma in reactive gas generator, comprising:

a switching power source;

a transformer comprising a transformer primary and a plasma secondary; and a series resonant circuit comprising a resonant inductor and a resonant capacitor coupled between the switching power source and the transformer primary, and a controller;

the switching power source providing a first AC voltage across the series resonant circuit, the first AC voltage having a frequency at a substantially resonant frequency of the series resonant circuit;

in response to the first AC voltage, the series resonant circuit providing a substantially resonant AC voltage across the transformer primary to induce the substantially resonant current within the transformer primary for generating the plasma secondary;

upon generation of the plasma secondary, the resonant inductor limiting current flowing to the switching power supply;

the controller providing signals to the switching power source to modulate the duty cycle of the first AC voltage to further limit the current flowing to the switching power supply subsequent to generation of the plasma secondary.

22. A method of providing power for igniting a plasma in a reactive gas generator, comprising:

coupling a series resonant circuit that comprises a resonant inductor and a resonant capacitor between a switching power source and a transformer, the transformer having a transformer primary and a plasma secondary;

providing a first AC voltage from the switching power source across the series resonant circuit, the first AC voltage having a frequency at a substantially resonant frequency of the series resonant circuit;

in response to the first AC voltage, providing the substantially resonant AC voltage from the series resonant circuit across the transformer primary to induce the substantially resonant current within the transformer primary for generating the plasma secondary;

upon generation of the plasma secondary, the resonant inductor limiting current flowing to the switching power supply;

modulating the duty cycle of the first AC voltage from the switching power source to further limit the current flowing to the switching power supply subsequent to generation of the plasma secondary.

* * * * *